ical notation: $F_{(4, 25)}$...

United States Patent
Rau

(10) Patent No.: US 8,466,748 B2
(45) Date of Patent: Jun. 18, 2013

(54) AMPLIFIER CIRCUIT AND METHOD FOR CONDITIONING AN OUTPUT CURRENT SIGNAL OF A DETECTOR ELEMENT

(75) Inventor: Ernst Rau, Bad Krozingen (DE)

(73) Assignee: Northrop Grumman LITEF GmbH, Freiburg (DE)

( * ) Notice: Subject to any disclaimer, the term of this patent is extended or adjusted under 35 U.S.C. 154(b) by 68 days.

(21) Appl. No.: 13/065,484

(22) Filed: Mar. 23, 2011

(65) Prior Publication Data

US 2012/0326779 A1     Dec. 27, 2012

(30) Foreign Application Priority Data

Mar. 23, 2010 (DE) .................. 10 2010 012 433

(51) Int. Cl.
*H03F 3/08* (2006.01)

(52) U.S. Cl.
USPC ....................... 330/308; 250/214 A

(58) Field of Classification Search
USPC .................. 330/308, 76; 250/214 A
See application file for complete search history.

(56) References Cited

U.S. PATENT DOCUMENTS

| | | | |
|---|---|---|---|
| 4,639,134 A | 1/1987 | Bletz | |
| 5,023,951 A | 6/1991 | Kahn | |
| 5,982,232 A * | 11/1999 | Rogers | ............ 330/69 |
| 6,643,472 B1 | 11/2003 | Sakamoto et al. | |
| 7,173,230 B2 * | 2/2007 | Charbon | ........... 250/214 A |
| 7,616,062 B2 * | 11/2009 | Miyamoto et al. | ........... 330/308 |
| 2003/0234684 A1 | 12/2003 | Oppelt | |
| 2004/0065876 A1 | 4/2004 | Delbruck et al. | |
| 2009/0163784 A1 | 6/2009 | Sarpeshkar et al. | |

FOREIGN PATENT DOCUMENTS

WO    WO-9603626 A1    8/1996

* cited by examiner

*Primary Examiner* — Henry Choe
(74) *Attorney, Agent, or Firm* — Elliott N. Kramsky

(57) ABSTRACT

An amplifier circuit comprises a detector element with signal-dependent output current, a load resistance and an operational amplifier. A terminal of the detector element and the load resistance are electrically connected to an input of the operational amplifier. The load resistance is provided in the form of at least two series-connected part-resistors. A compensation capacitor is in each case connected in parallel with each part-resistor, or a number of series-connected part-compensation capacitors are connected in parallel with each part-resistor. The output of the operational amplifier is connected to two of the compensation capacitors or part-compensation capacitors by a feed capacitor so that the effect of a parasitic capacitance of the load resistance is at least partially compensated for.

12 Claims, 7 Drawing Sheets

AMPLIFIER CIRCUIT AND METHOD FOR CONDITIONING AN OUTPUT CURRENT SIGNAL OF A DETECTOR ELEMENT

BACKGROUND

1. Field of the Invention

Embodiments of the invention relate to amplifier circuits, detector circuits with photodiode and methods for conditioning output current signals of detector elements which output an output current dependent on a physical quantity to be detected.

2. Description of the Prior Art

When a physical quantity which can be detected by a detector element, e.g. light, temperature, pressure, etc., is applied to a number of detector elements or sensors, e.g. photodiodes, they generate an output current signal, the output current intensity depending on the amount or intensity or amplitude of the physical quantity to be detected, e.g. light intensity, temperature, pressure. The output current signal is converted into a voltage signal by means of a load resistance or of a transimpedance amplifier, respectively.

FIG. 1 shows a transimpedance amplifier circuit in which a detector element is shown simplified as a current source 10 and is connected to the inverting input of an operational amplifier (OPV) 20. The output O of the OPV 20 is connected to the inverting input via an ohmic resistance 30 with a parasitic capacitance 40.

FIG. 2 relates to an amplifier circuit for converting an output current signal of a detector element into a voltage signal by means of a load resistance 31. The detector element is shown simplified as a current source 10 which is provided between a non-inverting input of an OPV 21 and a reference potential. The load resistance 31 with its parasitic capacitance is also connected between the non-inverting input and the reference potential so that the output current of the current source 10 flows through the load resistance 31.

Assuming that the amplifier circuits according to FIGS. 1 and 2 are only operated with direct current and direct voltage or with slowly variable signals and using as a basis an ideal behavior of the operational amplifier, the amount of the voltage at output 0 is obtained by multiplying the respective output signal current by the load resistance. If the output signal current is a rapidly variable signal, the amplifier circuit exhibits a low-pass characteristic due to the parasitic capacitance of the load resistance.

This low-pass characteristic can be compensated for, for example, by providing a corresponding high-pass filter in the further signal path, a signal noise also being amplified.

FIG. 3 relates to a further amplifier circuit with the load resistance 31 according to FIG. 2, by means of which the parasitic capacitance 51 of a detector element is reduced or compensated for by means of a bootstrap circuit. The detector element is again shown simplified as a current source 10, the first terminal of which is coupled to a direct-voltage source via a bias resistance 6 and the second terminal of which is coupled to a non-inverting input of an OPV 21. An output signal of the OPV 21 is coupled back to the non-inverting input via a bootstrap capacitor 52.

Due to a propagation delay in the OPV 21, a phase shift occurs between the output and input signal of the OPV 21 so that the compensation effect is impaired toward higher frequencies.

SUMMARY AND OBJECTS OF THE INVENTION

The invention is based on the object of providing an amplifier circuit with greater bandwidth for detector elements, the output current of which is signal-dependent. The object comprises a method for conditioning an output current signal of a detector element.

This object is achieved by an amplifier circuit and by a method as claimed in the independent claims. Advantageous embodiments are obtained from the respective subclaims.

In a first aspect, the invention provides an amplifier circuit. A detector element, having a signal-dependent output current, a load resistance and an operational amplifier are provided. A terminal of the detector element and the load resistance are electrically connected to an input of the operational amplifier. The load resistance is in the form of at least two series-connected part-resistors.

In each case, a compensation capacitor is connected in parallel with the part-resistors. Alternatively, a number of series-connected part-compensation capacitors are connected in parallel with the part-resistors.

An output of the operational amplifier is connected to two of the compensation capacitors by a feed capacitor.

In a second aspect, the invention provides a method for conditioning a signal-dependent output current signal of a detector element. Such method includes the step of converting the output current signal into a voltage signal by means of a load resistance and an operational amplifier. The load resistance is provided as a series circuit of at least two part-resistors. In each case a compensation capacitor is connected in parallel with the part-resistors or with a number of series-connected part-compensation capacitors connected in parallel with the part-resistors.

An output signal of the operational amplifier is fed back via a feed capacitor between two compensation capacitors or part-compensation capacitors, thereby compensating for a low-pass effect of parasitic capacitances of the part-resistors.

In the text which follows, embodiments of the invention will be explained in greater detail with reference to the figures. The main attention is on the description and the clarification of the principles forming the basis of the invention. Features of the different embodiments can be combined with one another providing they do not exclude one another. In the text which follows, the invention will be explained in greater detail with reference to the figures.

DETAILED DESCRIPTION OF THE PREFERRED EMBODIMENT

Figure 4:
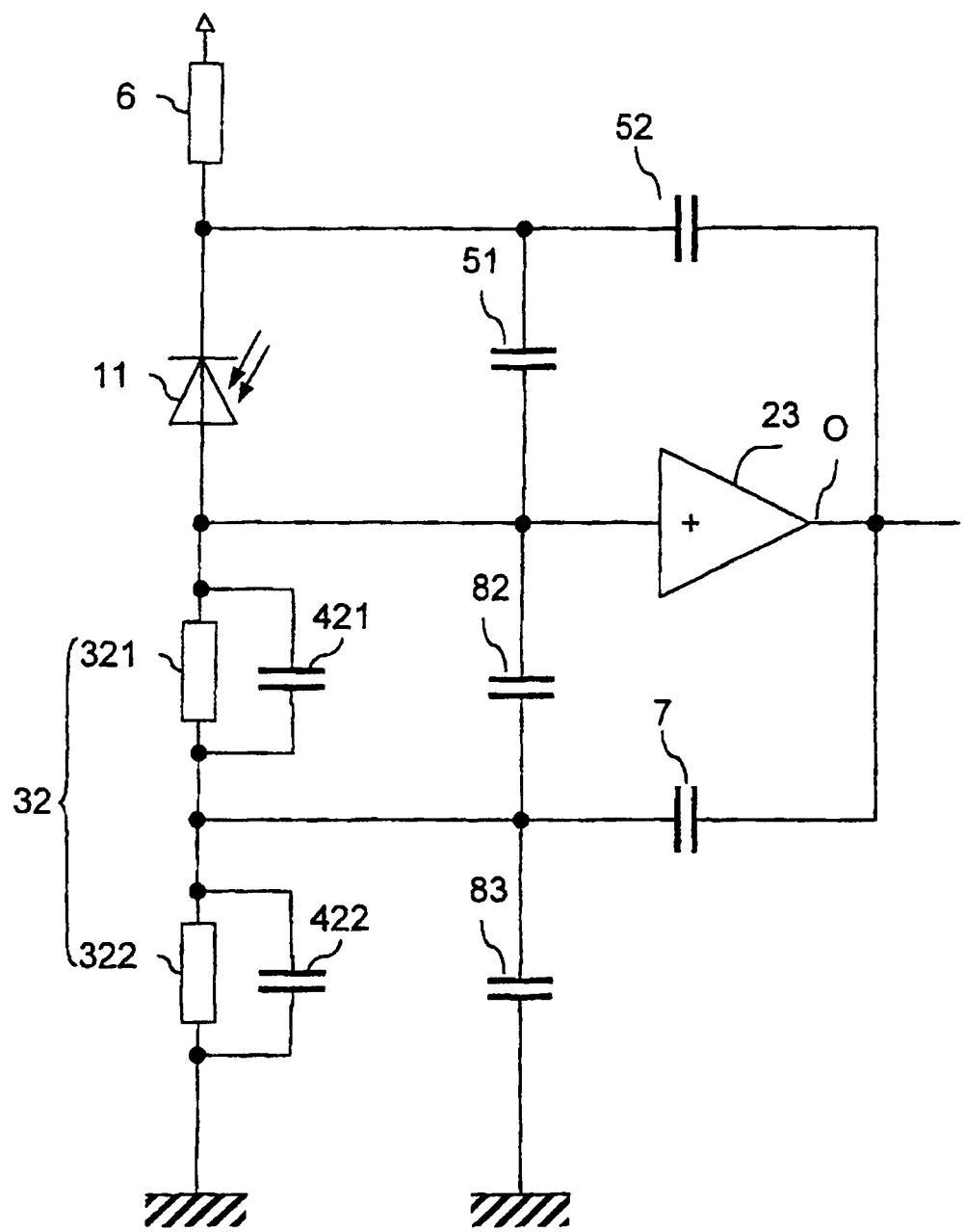
FIG. 4 shows a simplified circuit diagram of an amplifier circuit with two part-load resistances and two compensation capacitors according to one embodiment.

FIG. 4 shows the circuit diagram of an amplifier circuit according to one embodiment with a detector element 11, the output current signal of which is to be converted into a voltage signal. According to one embodiment, the detector element 11 is a photodiode, for example a PIN photodiode with low signal-dependent output current, for example a PIN photodiode for use in an interferometer or for recording interferometer signals in a fiberoptical gyroscope. According to other embodiments, the detector element is an alternating-current signal source, a magnetic pickup, a piezoelectric sensor or a thermoelement.

The detector element 11 can be connected, on the one hand, via a bias resistor 6 to a voltage source. On the other hand, the detector element 11 is electrically connected to the non-inverting input of an operational amplifier (OPV) 23 and to a load resistance which is divided into two series-connected part-resistors 321, 322 and coupled to a reference potential, e.g. ground. According to other embodiments, no bias resistor 6 is provided.

A parasitic capacitance inherent to the detector element 11 is represented by the capacitor 51 connected in parallel with the detector element 11. In the same manner, the capacitors 421, 422 represent the parasitic capacitances inherent in the respective part-resistors 321, 322. Connected in parallel with the part-resistors 321, 322, a compensation capacitor 82, 83 for partially compensating for capacity fluctuations of the capacitors 421, 422 is provided in each case. The compensation capacitors 82, 83 are connected in series with one another between the non-inverting input of the OPV 23 and the reference potential.

According to one embodiment, a bootstrap capacitor 52, via which an output signal is coupled back from output O of the OPV 23 to the non-inverting input, is provided for compensating for the parasitic capacitance 51 of the detector element 11. According to other embodiments, no bootstrap capacitor is provided.

To compensate for the low-pass effect of the parasitic capacitances of the part-resistors 321, 322, the output signal from output O of the OPV 23 is fed by a feed capacitor 7 into the series of compensation capacitors 82, 83, for example between compensation capacitors 82, 83.

As can be seen in FIG. 4, the equivalent circuit diagram of a real load resistance consists of the parallel connection of load resistance and parasitic capacitor. If the load resistance is divided into two series-connected part-resistors, the absolute resistance value remains unchanged while the parasitic capacitance is almost halved. The method cannot be continued arbitrarily, however, since parasitic capacitors from connecting surfaces are then added.

The capacitance values of the parasitic capacitors are subject to great fluctuations since they are normally not specified by the manufacturers of the resistors. For this reason, a compensation capacitor specified closely with respect to its capacitance is arranged in parallel with the load resistance or in each case in parallel with the two part-resistors. The capacitance of the compensation capacitor can be selected to be of the same order of magnitude or slightly larger than the capacitance of the parasitic capacitor.

Figure 5:
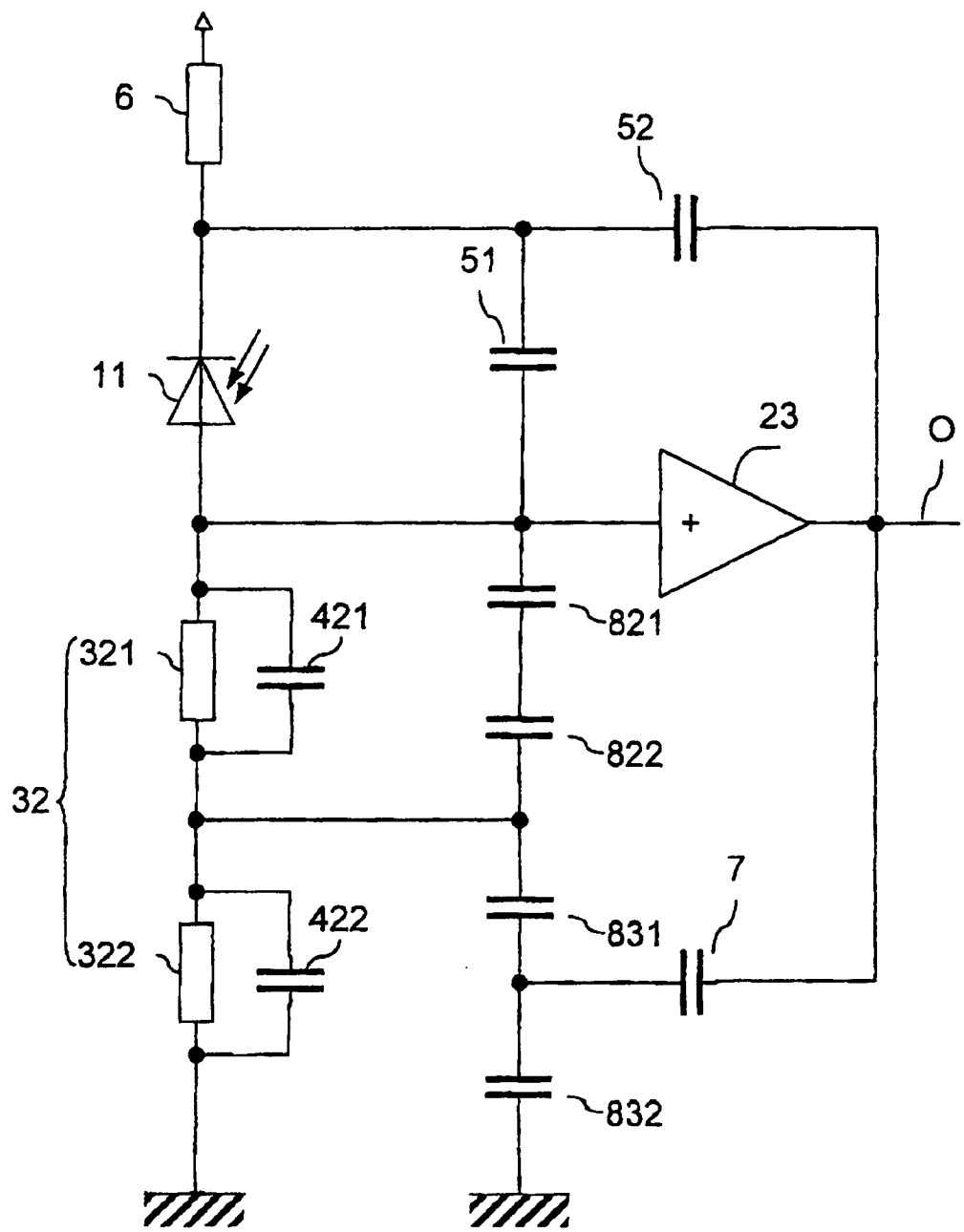
FIG. 5 shows a simplified circuit diagram of an amplifier circuit with two part-load resistances and four part-compensation capacitors according to another embodiment.

FIG. 5 shows an embodiment according to which the compensation capacitors 82, 83 according to FIG. 4 are divided into in each case two part-capacitors 821, 822, 831, 832 and which are connected in series with one another. At a suitable point, the output signal is fed from the output of the OPV 23 via the feed capacitor 7 into the series of part-capacitors 821, 822, 831, 832, for example, according to FIG. 5, between the two part-capacitors 831, 832 which are allocated to the part-resistor 322 oriented toward the reference potential. The capacitance value of the feed capacitor is less than 10 pF, e.g. 2 pF or lower, but at least, for example, 500 fF.

According to other embodiments having four part-capacitors 821, 822, 831, 832, the feed capacitor 7 can also be connected to the connection between the part-capacitors 822, 831. Apart from the size of the capacitors, the ratio between them is also decisive for specifying the connecting point. Since this leads to a very great variety, the capacitors 821, 822, 831, 832 are all selected to be equal according to the above example. The node between the capacitors 831, 832 was determined as being optimal for the feed-in.

The load resistance 32 can be of the order of magnitude of between 100 k$\Omega$ and 1 M$\Omega$, the part-capacitors 821, 822, 831, 832 can be of the order of magnitude of between about 0.2 pF and 2 pF. The current in the load resistance can be between some nA and a few $\mu$A in the case of a photodiode. In the case of other sensors having a higher signal current, the load resistance must be adapted accordingly.

According to other embodiments having four part-capacitors 821, 822, 831, 832, the output signal can be fed in between the two part-capacitors 821, 822 which are allocated to the part-resistor 321 oriented towards the OPV 23. Other embodiments relate to arrangements in which the load resistance 32 is divided into more than two part-resistors.

Figure 1:
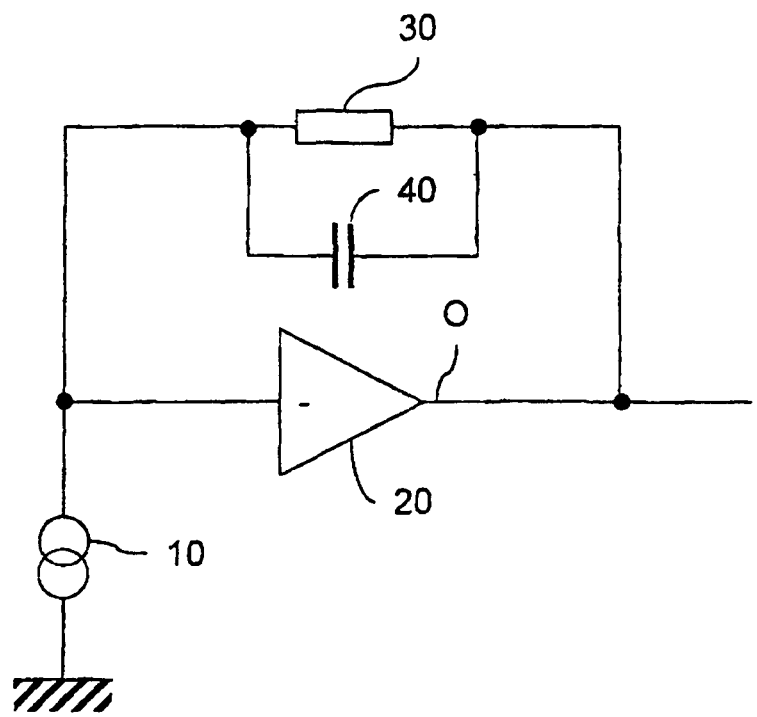
FIG. 1 shows a simplified circuit diagram of a transimpedance amplifier circuit according to the prior art.
Figure 2:
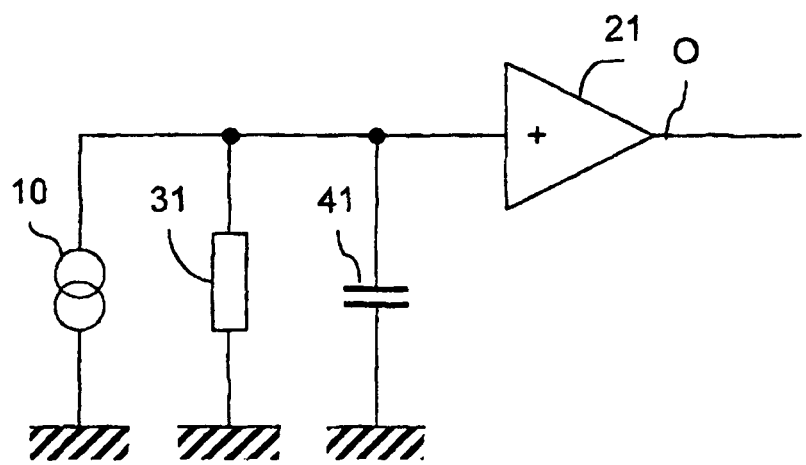
FIG. 2 shows a simplified circuit diagram of an amplifier circuit with a load resistance according to the prior art.
Figure 3:
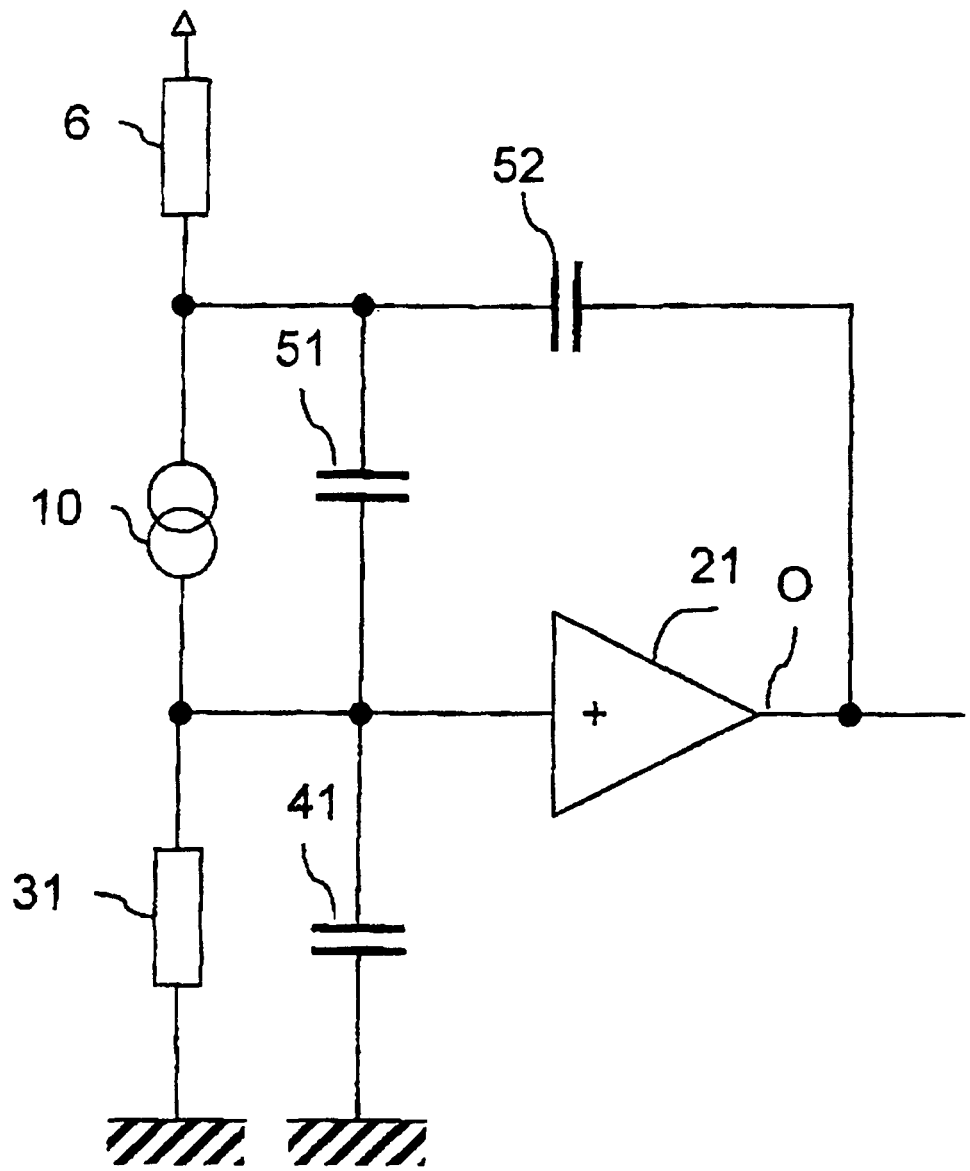
FIG. 3 shows a simplified circuit diagram of an amplifier circuit with bootstrap capacitor according to the prior art.

FIGS. 6 to 9 show in each case frequency-dependent transfer functions of the amplifier circuits according to FIGS. 2, 3 and 5. An attenuation of the output signal is in each case plotted in decibels along the ordinate and the frequency plotted in hertz along the abscissa. The transfer functions have been determined by tests and simulations.

Figure 6:
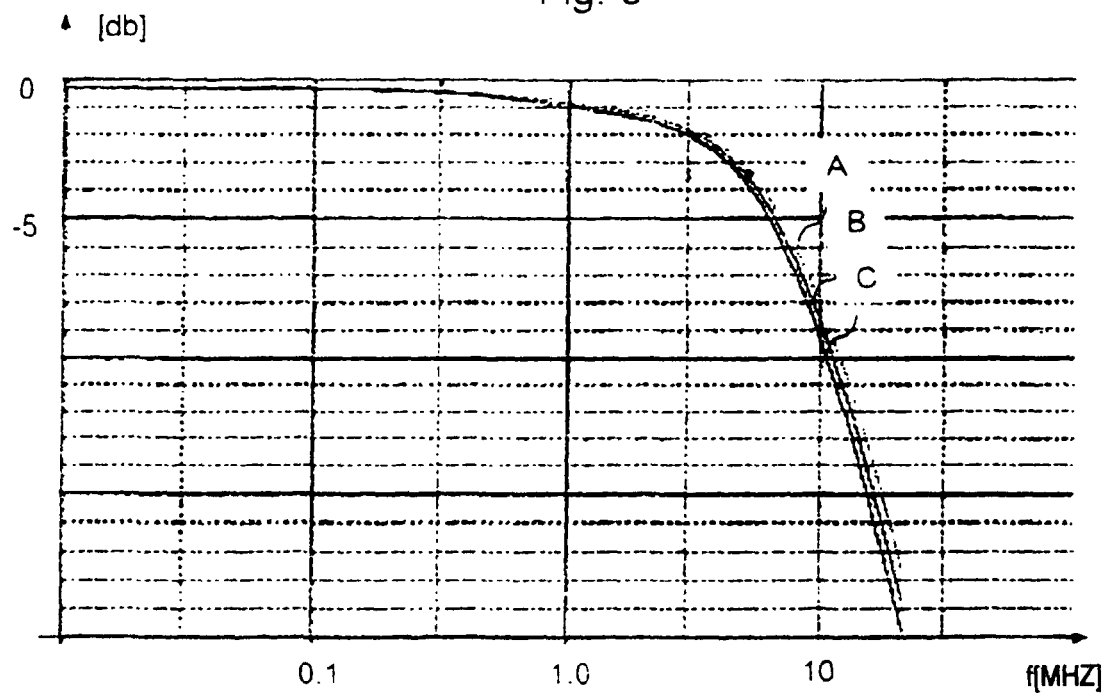
FIG. 6 shows a transfer function of the amplifier circuit according to FIG. 3 for explaining the effect of the parasitic capacitance of a detector element.

Transfer functions A, B, C shown in FIG. 6 show the influence of the parasitic capacitance of a photodiode on the bandwidth of the amplifier circuit with bootstrap capacitor according to FIG. 3. A parasitic capacitance of 1 pF was assumed for transfer function A, of 2 pF for transfer function B and of 3 pF for transfer function C. When a bootstrap capacitor is used, fluctuations of the parasitic capacitance only have a slight influence on the bandwidth of the total circuit. In the example shown, the difference between photodiodes with parasitic capacitances of 1 pF and 3 pF is 400 kHz. The low-pass filter given by the load resistance and the parasitic capacitance of the load resistance is then a time constant determining the amplifier circuit.

Figure 7:
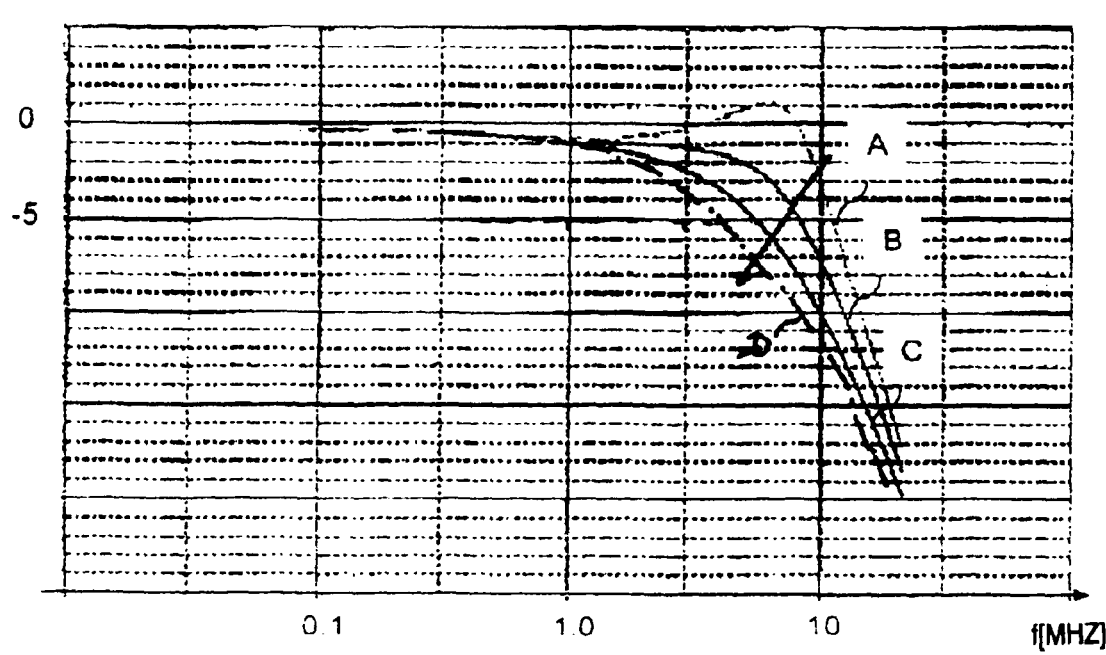
FIG. 7 shows a transfer function of the amplifier circuit according to FIG. 2 for explaining the effect of the parasitic capacitance of a load resistance.

The transfer functions A, B, C, D shown in FIG. 7 show the influence of the parasitic capacitance of the load resistance on the bandwidth of the amplifier circuit. In this context, 0.2 pF was assumed for the parasitic capacitance in curve A), 0.7 pF for B), 1.2 pF for C) and 1.7 pF for D). Since four capacitors are connected in series, the smallest one has 200/4=50 fF and the largest one 1700/4, approximately 400 fF. The bandwidth extends from 2.7 MHz with 400 fF to 10.1 MHz with 50 fF, i.e. differs approximately by a factor of 4.

Figure 8:
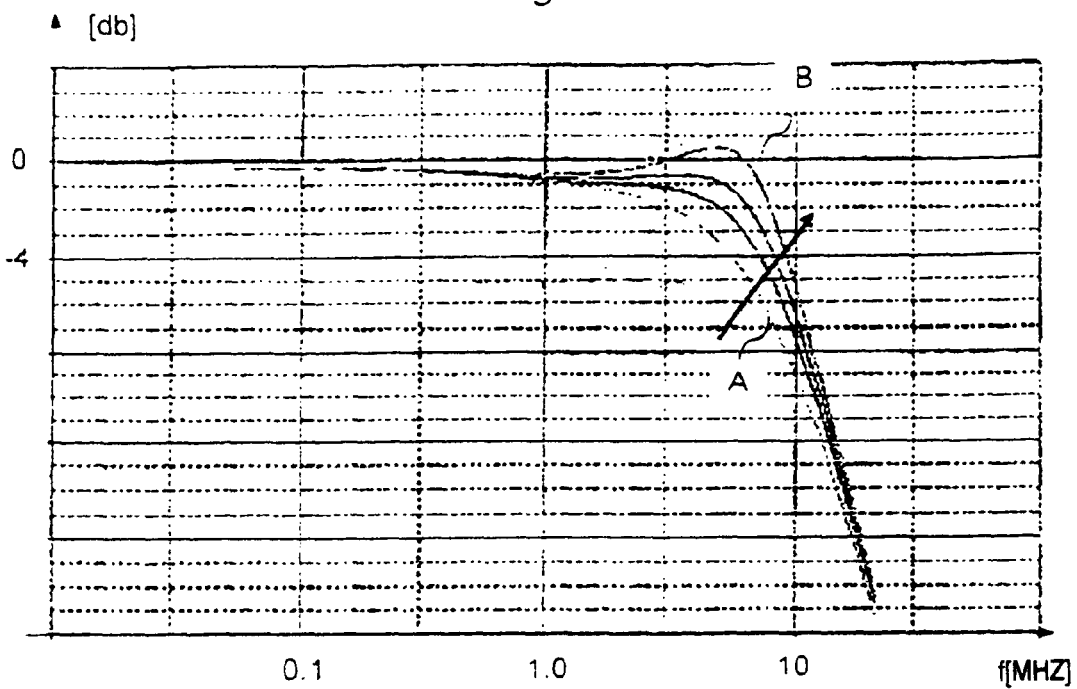
FIG. 8 shows a transfer function of the amplifier circuit according to FIG. 5 for explaining the effect of a feed capacitor according to one embodiment.

FIG. 8 shows the influence of the feed capacitor on the bandwidth of the amplifier circuit according to FIG. 5. A capacitance of the feed capacitor of 0 pF has been assumed for calculating the curve A, a value of about 2 pF for curve B. Without a feed capacitor, the bandwidth is 4.8 MHz and about 8.8 MHz with a feed capacitor of 2 pF.

Figure 9:
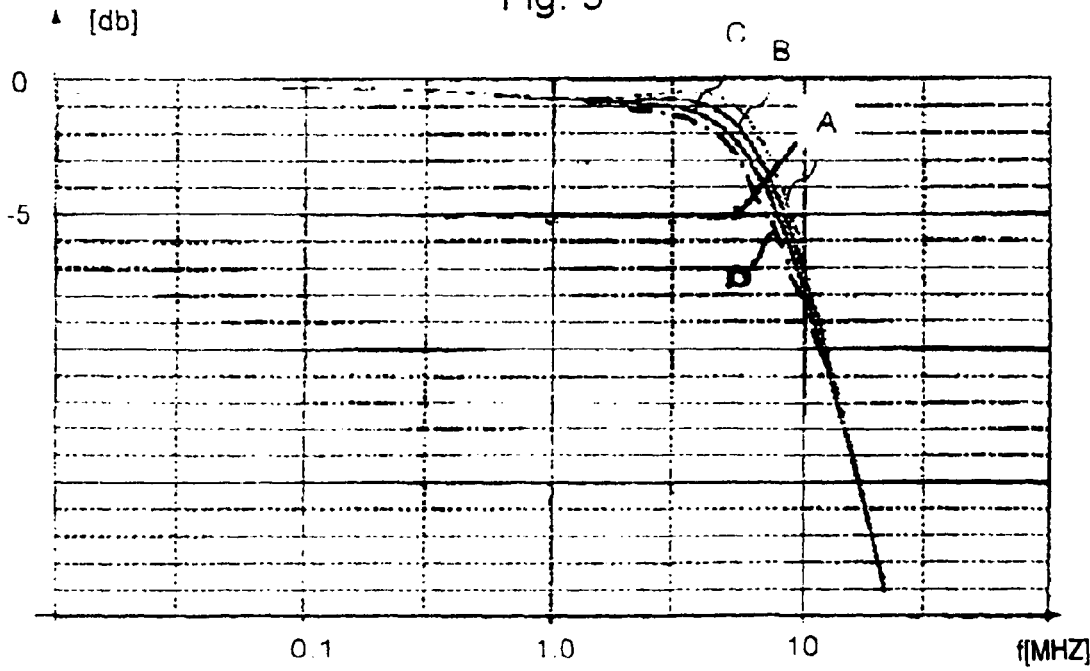
FIG. 9 shows a further transfer function for the amplifier circuit according to FIG. 5 for explaining the effect of the parasitic capacitances.

FIG. 9 shows the reduced influence of the parasitic capacitors 421, 422 on the bandwidth of the amplifier circuit according to FIG. 5. The four curves A, B, C, D were calculated with different values for the capacitance of the parasitic capacitors: A) 100 fF, B) 150 fF, C) 200 fF, D) 250 fF. As can be seen in comparison with FIG. 7, the dependence of the bandwidth of the amplifier circuit on the range of fluctuation of the parasitic capacitances of the load resistances is clearly less.

Figure 10:
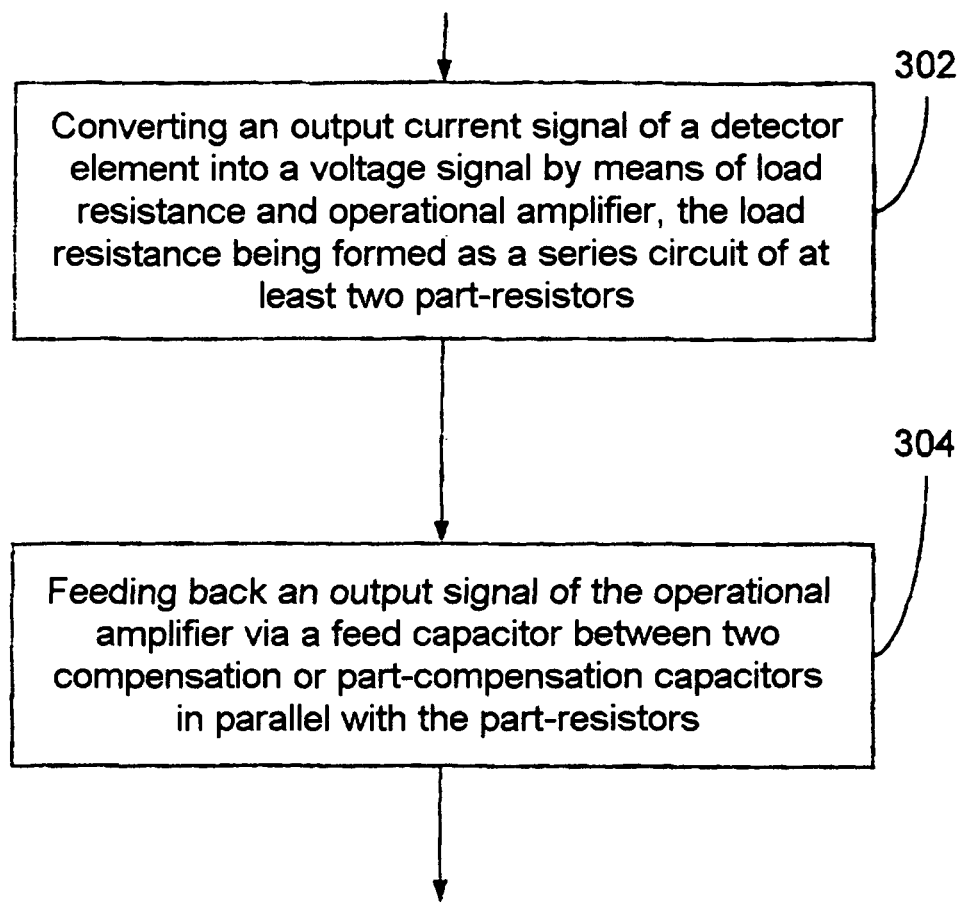
FIG. 10 shows a simplified flow chart for a method for conditioning an output current signal of a detector element.

According to the method shown in FIG. 10, for conditioning an output current signal of a detector element, the output current signal of which is signal-dependent, the output current signal is converted into a voltage signal by means of a load resistance and an operational amplifier (302). In this arrangement, the load resistance is provided as a series circuit of at least two part-resistors. In each case, a compensation capacitor is connected in parallel with the part-resistors or a number of series-connected part-compensation capacitors are connected in parallel with the part-resistors. The output signal of the operational amplifier is fed back via a feed capacitor between two compensation capacitors or part-compensation capacitors (304), compensating for a low-pass effect of parasitic capacitances of the part-resistors.

According to one embodiment, the output signal of the operational amplifier is additionally fed back via a bootstrap capacitor and the detector element to the input of the operational amplifier, compensating for a parasitic capacitance of the detector element.

While this invention has been described with reference to its presently preferred embodiment, it is not limited thereto. Rather, the invention is limited only insofar as it is defined by the following set of patent claims and includes within its scope all equivalents thereof.

What is claimed is:

1. An amplifier circuit comprising:
   a detector element with signal-dependent output current, a load resistance and an operational amplifier, a terminal of the detector element and the load resistance being electrically connected to an input of the operational amplifier,
   wherein the load resistance is provided in the form of at least two series-connected part-resistors; and
   a compensation capacitor is in each case connected in parallel with the part-resistors or a number of series-connected part-compensation capacitors are connected in parallel with the part-resistors; and
   an output of the operational amplifier is connected to two of the compensation capacitors by a feed capacitor.

2. The amplifier circuit as claimed in claim 1, wherein a capacitance of the respective compensation capacitor is of an order of magnitude of a parasitic capacitance of the respective part-resistor.

3. The amplifier circuit as claimed in claim 2, wherein the capacitance of the respective compensation capacitor is greater than the parasitic capacitance of the respective part-resistor.

4. The amplifier circuit as claimed in claim 3, wherein in each case two part-compensation capacitors are provided.

5. The amplifier circuit as claimed in claim 1, wherein the load resistance and the detector element are connected in series with a direct-voltage source.

6. The amplifier circuit as claimed in claim 1, wherein the detector element is an alternating-current signal source.

7. The amplifier circuit as claimed in claim 1, wherein the detector element is a photodiode.

8. The amplifier circuit as claimed in claim 7, wherein the detector element is an optical PIN diode.

9. The amplifier circuit as claimed in claim 1, wherein to compensate for a parasitic capacitance of the detector element an output signal of the operational amplifier is coupled back to the input of the operational amplifier via a bootstrap capacitor and the detector element.

10. The amplifier circuit as claimed in claim 1, wherein a bootstrap capacitor is provided between a terminal of the detector element not connected to the operational amplifier and the output of the operational amplifier.

11. A method for conditioning an output current signal of a detector element, the output current signal being signal-dependent, comprising:
    converting the output current signal into a voltage signal by means of a load resistance and an operational amplifier, the load resistance being provided as a series circuit of at least two part-resistors and in each case a compensation capacitor being connected in parallel with the part-resistors or a number of series-connected part-compensation capacitors being connected in parallel with the part-resistors;
    feeding back an output signal of the operational amplifier via a feed capacitor between two compensation capacitors or part-compensation capacitors, compensating for a low-pass effect of parasitic capacitances of the part-resistors.

12. The method as claimed in claim 11, comprising feeding back the output signal of the operational amplifier to the input of the operational amplifier via a bootstrap capacitor and the detector element, compensating for a parasitic capacitance of the detector element.

* * * * *